United States Patent [19]

Michel

[11] Patent Number: 4,626,772
[45] Date of Patent: Dec. 2, 1986

[54] PROCESS AND DEVICE FOR DETERMINING A PARAMETER ASSOCIATED WITH A FAULTY ELECTRIC CONDUCTOR, USING A COMPOSITE MONITORING SIGNAL

[75] Inventor: Souillard Michel, Fontenay aux Roses, France

[73] Assignee: Enertec, Montrouge, France

[21] Appl. No.: 618,290

[22] Filed: Jun. 7, 1984

[30] Foreign Application Priority Data

Jun. 9, 1983 [FR] France .................. 83 09559

[51] Int. Cl.⁴ .................................. G01R 31/08
[52] U.S. Cl. .................................... 324/52
[58] Field of Search ............... 324/52; 361/80; 179/175.3 F

[56] References Cited

U.S. PATENT DOCUMENTS

| | | | |
|---|---|---|---|
| 3,369,156 | 2/1968 | Souillard | 361/80 |
| 3,593,124 | 7/1971 | Souillard et al. | 324/52 |
| 3,612,989 | 10/1971 | Souillard et al. | 324/52 |
| 3,800,215 | 3/1974 | Souillard | 324/52 |
| 4,063,163 | 12/1977 | Vitins | 324/52 |
| 4,063,164 | 12/1977 | Lanz et al. | 324/52 |
| 4,063,166 | 12/1977 | Glavitsch et al. | 324/52 |
| 4,251,766 | 2/1981 | Souillard et al. | 324/52 |

Primary Examiner—Stanley T. Krawczewicz
Attorney, Agent, or Firm—Dale Gaudier

[57] ABSTRACT

Method and apparatus for determining, at a measurement point in a faulty conductor of electrical energy, a fault parameter such as the distance between the point of measurement and such fault or the direction of such fault. As a signal of a fault current, the device utilizes a signal $I_{pa}$ formed by a linear combination of a signal representative of homopolar current and a signal representative of an inverse current associated with a fault. The invention is particularly applicable in the case of networks having at the point of measurement an insensitivity to homopolar current or to inverse current.

5 Claims, 2 Drawing Figures

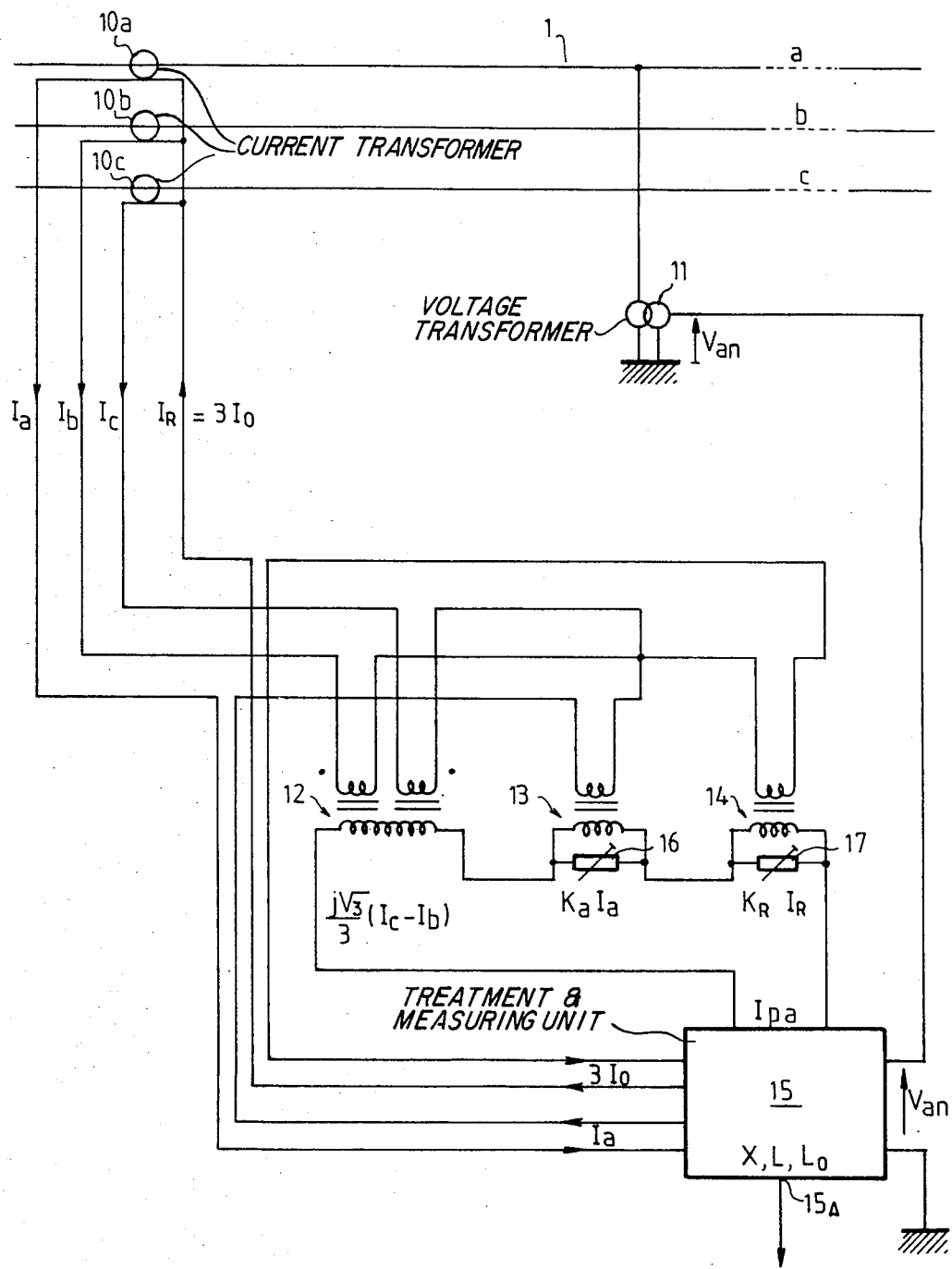

PROCESS AND DEVICE FOR DETERMINING A PARAMETER ASSOCIATED WITH A FAULTY ELECTRIC CONDUCTOR, USING A COMPOSITE MONITORING SIGNAL

This invention relates to a process and a device for determining, at one measurement point in a faulty conductor carrying electric energy, particularly a three-phase conductor, a defect parameter such as the distance between the point of measurement and such defect or the direction of such defect, consisting of: producing instantaneous measurement signals as to the voltage and current for such conductor, of which the linear resistance and inductance are known; forming, in accordance with Ohm's law applied to the conductor, combinations of such signals with at least one magnitude linked to an impedance, each combination using a monitoring signal representative of the fault current; and giving the defect parameter the value for which a group of at least one of such combinations verifies Ohm's law.

Processes of this type and devices for their application are known and some examples thereof are given in U.S. Pat. Nos. 3,612,989, 3,369,156, 3,593,124 and 4,251,766.

In the most traditional forms of such previous techniques, Ohm's law is applied to the supposedly faulty conductor which is treated as an antenna, and as exclusively resistive and conductive. The result is an equation containing two unknowns consisting of the resistance of the fault and the distance separating such fault from the point of measurement. This equation is used to determine one or several fault parameters.

For example, determination of the distance of the fault for a three-phase conductor may be obtained by application of Ohm's law to two groups of signals measuring voltage and current corresponding to different moments of measurement and using as a monitoring signal, representative of the fault current, a current proportional to and in phase with the homopolar current.

Such known processes, which provide satisfactory results under favorable conditions, suffer however from the inconvenience of a lack of sensitivity in the monitoring signal employed, especially in certain circuit configurations. In particular, it has been discovered that, according to the structure of the network and the relative values of homopolar and inverse impedances of the sources at the ends of a faulty conductor, the homopolar or inverse currents might tend towards zero at one end of the conductor. The result in the determination of fault parameters is inaccuracies which, in unfavorable conditions, may become unacceptable.

In this context, the purpose of the present invention is to propose a process and a device for determining fault parameters which, without being appreciably more complex than the the known processes and devices previously mentioned, are more accurate that the latter.

The process in accordance with the invention is essentially characterized by the fact that the monitoring signal used to represent the fault current consists of a linear combination of a signal representative of the homopolar current and of a signal representative of the inverse current. Apparatus constructed in accordance with the invention includes means for forming such a linear combination.

In the case of a fault between one phase of the conductor and the earth or ground, the monitoring signal is preferably proportional to the sum of a signal representative of the homopolar current and twice a signal representative of the inverse current asssociated with the fault phase.

In the case of a fault between the first two of the three phases of a three-phase conductor, the monitoring signal is preferably proportional to the sum of a signal representative of the homopolar current and of twice a signal representative of the invorse current associated with the third of said phases and dephased by 90° in relation to such sum.

Other characteristics and advantages of the invention will emerge from the description given of it below, which is indicative and in no way restrictive, in reference to the drawings annexed, in which:

FIG. 2 is a diagram of the device of the invention in a case of a measurement of the distance of a fault between the phase "a" and the earth or ground in a three-phase conductor.

Figure 1:
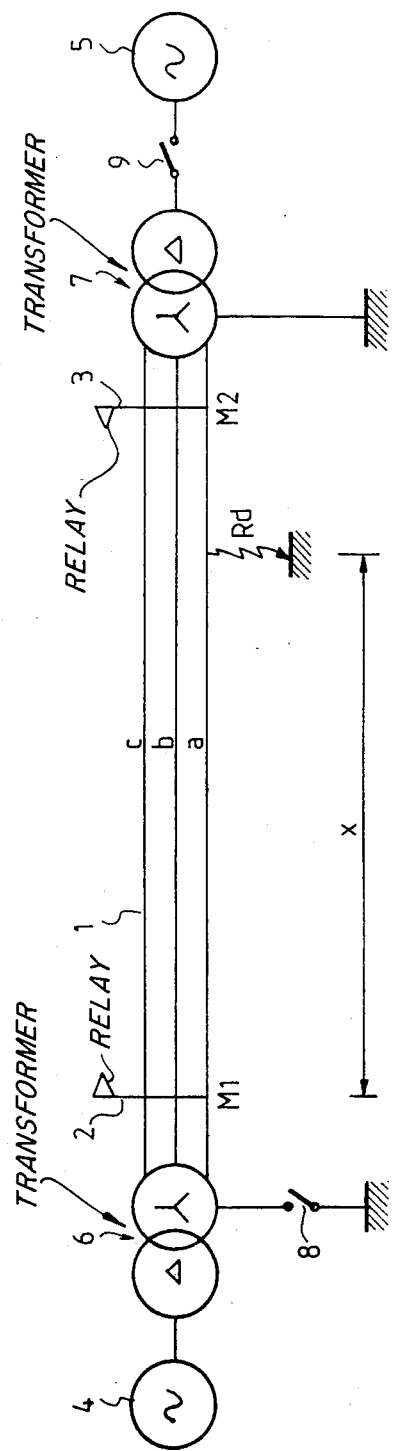
FIG. 1 is a diagram of a portion of faulty conductor.

As shown in FIG. 1, the electric conductor 1 has, at each of its ends, a relay 2, 3 using for the determination of a fault parameters, and for measuring voltage signals $V(t)$ and current signals $I(t)$ appearing at each moment on the conductor at the point of location of such relay, e.g. at measurement points M1, M2.

A relay installed on a polyphase conductor measures as many voltage and current signals (for example, 3 signals $V_a(t)$, $V_b(t)$, $V_c(t)$ for voltage and 3 signals $I_a(t)$, $I_b(t)$, $I_c(t)$ for current where a, b, and c indicate a particular conductor of the three phase network) as the conductor has phases.

In accordance with known techniques for determining fault parameters such as the direction in relation to the point of measurement of the location of such fault, the area in which it is located, the distance x away from the point of measurement or the electrical resistance to which it corresponds, the process of the invention applies Ohm's law to measurements made of the faulty conductor, where at least the linear resistance, R, and the inductance L, per unit length of the faulty conductor are known, to determine such fault parameters.

In previous techniques which take account of the resistance of the fault $R_d$, the hypothesis is generally made that the instantaneous current of the fault, $I(t)$, is identical in phase and amplitude to a combination of the currents appearing at the point of measurement; this latter hypothesis, for example, relates to the homopolar current in the case of an earth-to-phase fault in a polyphase conductor.

Such known processes thus lead to the following general formulation of Ohm's law applied to a single-phase conductor:

$$V = [c] x \cdot R \cdot I + + x \cdot L \cdot \frac{dI}{dt} + R_d \cdot I \quad (1)$$

where V and I are the measurement signals produced by the voltage and current relays, respectively, x is the distance to the fault, and $dI/dt$ the time derivative of the current measurement signal. It will be seen that this expression combines the measurement signals V and I with the magnitudes x.R, x.L, and $R_d$ of which the first two are linked to the linear resistance R and inductance L of the conductor.

The physical magnitudes V and I being known for any moment, the same applies to the magnitude dI/dt.

For example, measurement of the distance x may be obtained following known procedures by observing Ohm's law at a moment $t_o$ such $I(t_o)=0$; as the fault current is then supposed to be zero, the fault resistance plays no further part in the equation and the distance away of the fault is given by:

$$x = V(t_0)/\left(R \cdot I(t_o) + L \cdot \frac{dI}{dt}(t_o)\right)$$

that is to say again:

$$x = V(t_o)/L \cdot \frac{dI}{dt}(t_o)$$

Equivalent considerations prevail in the previous processes for faults on multiphase conductors.

More precisely, a fault between phase "a" and the earth on a three-phase conductor is traditionally analyzed by means of the relationship:

$$V_{an}=x(R.I_a+L.(dI_a/dt)+(L_o-L)(dI_o/dt))+3R_d.I_o$$

in which $V_{an}$ is the voltage of the loop "an" at the pont of measurement; $I_a$ is the current of the "a" phase at the point of measurement; $L_o$ is the linear homopolar inductance of the conductor; and $I_o$ is the homopolar current given by:

$$I_o=(I_a+I_b+I_c)/3,$$

"b" and "c" being the two other phases of the conductor; thus, for a single phase fault, detection of the area in relation to a reference distance X can be achieved in a known manner by comparison of the polarities of the voltages:

$$V_{an}-X(R.I_a+L.(dI_a/dt)+(L_o-L)(dI_o/dt)) \quad (2)$$

and $$R.I_a+L.(dI_a/dt)+(L_o-L)(dI_o/dt)$$

at the moment when the current $I_o$ moves to zero.

In a similar manner, a fault between the "a" and "b" phases of a three-phase conductor is traditionally analyzed by means of the relationship:

$$V_{ab}=x(R.I_{ab}+L.(dI_{ab}/dt))+R_d.I_{ab} \quad (3)$$

in which $V_{ab}$ is the voltage of the loop "ab" at the point of measurement; and $I_{ab}$ is the current of the loop "ab" at the point of measurement; thus, for a fault between phases, detection of the area in relation to a reference distance X may be achieved in a known manner by comparison of the polarities of the voltages:

$$V_{ab}-X(R.I_{ab}+L.(dI_{ab}/dt)) \quad (4)$$

and $$(R.I_{ab}+L.(dI_{ab}/dt)) \quad (5)$$

at the moment when the current $I_{ab}$ moves to zero.

In this context, the improvement contributed by the invention in determining the drop in voltage in the fault, consists in no longer directly applying the current measurement signal, such as $I_o$ or $I_{ab}$, as a signal representative of the fault current associated with the resistance $R_d$, but in using instead, as a signal representative of the fault current associated with the resistance $R_d$, a composite monitoring signal formed by a linear combination of a signal representative of the homopolar current and a signal representative of the inverse current.

It will be recalled that the inverse current $I_{ia}$ associated with the "a" phase and the signal representing it are defined by the expression:

$$I_{ia}=(\tfrac{1}{3})(I_a+A^2I_b+AI_c),$$

in which:

$$A=\exp(2.TL.j/3)$$

and where $$j=\sqrt{-1}.$$

The expressions for the inverse currents associated with the two other phases "b" and "c" are obtained from the expression for $I_{ia}$ by circular permutation of the "a", "b", and "c" indices.

Thus the composite monitoring signal $I_P$ used to represent the fault current corresponds in general to the expression:

$$I_p=k_1I_o+k_2I_i,$$

in which $k_1$ and $k_2$ are real or imaginary constants.

More precisely, for a single-phase fault, e.g. phase "a" to earth, the monitoring signal has the form:

$$I_{pa}=k_1I_o+k_2I_{ia},$$

and preferably the form:

$$I_{pa}=I_o+2I_{ia}.$$

It can indeed be shown that:

$$I_o+2I_{ia}=I_a-j.(3)^{\frac{1}{2}}.(I_b-I_b-I_c)/3.$$

so that the monitoring signal $I_{pa}$ may easily be obtained from the current measurement signals $I_a$, $I_b$ and $I_c$, the imaginary number j being representative of 90° angle of phase difference which, in known manner, may be obtained by integration or differentation.

However, the monitoring signal $I_{pa}$ relative to the "a" phase could be altered in relative proportion to $I_o$ and $I_{ia}$ by the addition of a term proportional to the homopolar current $I_o$; for example, the following value could be given to $I_{pa}$:

$$I_{pa}=k_oI_o+2I_{ia}.$$

The monitoring signals $I_{pb}$ and $I_{pc}$ which can be used for single-phase faults to earth relative to phases "b" and "c" respectively correspond to analogous expressions obtained by circular permutation of the indices "a", "b" and "c".

For a diphase fault relative to phases "b" and "c", a monitoring signal which can be used is for example $$I_{pbc}=j.(3)^{\frac{1}{2}}.(I_o+2I_{ia}).$$

It is shown in effect that:

$$j.(3)^{\frac{1}{2}}.(I_o+2I_{ia})=I_b-I_c+j.(3)^{\frac{1}{2}}.I_a$$

so that $I_{pbc}$ can readily be obtained from the current measurement signals $I_a$, $I_b$ and $I_c$.

However, the monitoring signal $I_{pbc}$ relative to the phases "b" and "c" for a diphase fault could be modified in relative proportion to $I_o$ and $I_{ia}$ by addition of a term proportion to the homopolar current $I_o$.

In the borderline case, for example, a monitoring signal $I'_{pcb}=j.2.(3)^{\frac{1}{2}}.I_{ia}$, which is independent of the homopolar current $I_o$, could be used both for the insulated diphase "bc" fault and for the diphase "bc" fault to earth, for which there is a phase "a" coupling in relation to the fault "bcn" and where there is an earth current of $3I_o$.

In addition to the elements already described, FIG. 1 represents two generators 4 and 5 each arranged at one end of the conductor 1, and transformers 6 and 7 respectively linking them to such conductor. A circuit breaker 8 connects the transformer 6 to earth and a circuit-breaker 9 connects the source 5 to the transformer 7.

The open position of these circuit-breakers provides an extreme example of asymmetry, with an infinite homopolar impedance and a zero homopolar current at $M_1$, and an infinite inverse impedance and a zero inverse current at $M_2$.

FIG. 2 illustrates in diagram form a device for performing the process of the invention in the case of a fault between phase "a" and the earth "a-to-n" fault) in a three-phase conductor.

Current transformers $10_a$, $10_b$, $10_c$ associated with the respective phases a, b, c of conductor 1 at the point of location $M_1$ of the relay 2 deliver current measurement signals $I_a$, $I_b$, $I_c$, representative of the currents in phases a, b, c, respectively, and the signal $$I_R=I_a+I_b+I_c=3I_o.$$

A voltage transformer 11 delivers the voltage measurement signal $V_{an}$ giving the potential of phase "a" with respect to earth.

The monitoring signal $I_{pa}$ is formed in a circuit comprising in series the secondaries of a common inductor or reactance 12 and transformers 13 and 14.

The common reactance 12 comprises two inverse primary windings respectively coupled to current measurement signals $I_b$ and $I_c$. The secondary of reactance 12 therefore develops a voltage proportional to the difference $I_c-I_b$ and displaced in phase by 90° in relation to $I_b-I_c$. The ratio of the primary voltage to the secondary voltage (common reactance factor) can be readily arranged to make it equal to $(3)^{-\frac{1}{2}}$. Thus the output of the secondary winding of reactance 12 can be arranged to be equal to $j\sqrt{3}/3(I_c-I_b)$.

The transformer 13 comprises a primary winding which is coupled (via a measuring unit 15 described below) to measure current $I_a$ and a secondary winding across which there is connected a variable resistance 16 developing a voltage $K_a.I_a$ proportional to $I_a$.

Similarly, transformer 14 has its primary connected to receive (via unit 15) a measuring current $I=3I_o$. The secondary of transformer 14 is connected in parallel with variable resistance 17 across which is developed a voltage $K_R.I_R$. proportional to $I_R$. The secondaries of reactance 12 and transformers 13 and 14 are connected in series and form the monitoring signal $I_{pa}$ which is applied to unit 15.

The signal $I_{pa}$, corresponding to the voltage developed in the secondary series circuit of the transformers 12, 13 and 14, is thus equal to $$RI_a+K_RI_R-j.(3)^{-\frac{1}{2}}.(I_b-I_c),$$

and, for example, to $$(3K_R+I)I_o+2I_{ia}$$

when $K_a=1$.

The monitoring signal $I_{pa}$, and the signals $3I_o$ (or $I_o$), $I_a$ and $V_{an}$ are connected to a treatment and measuring unit 15 which in itself is known, having the necessary information on the parameters X, L and $L_o$, and capable of providing at its output point 15A information on a fault by comparison of the polarity of the voltages given by the above equations (2) at the moment the value of monitoring signal $I_{pa}$ goes to zero. For example, unit 15 could comprise a microprocessor having associated therewith a solid state memory containing values representative of the parameters X, L and $L_o$, and equations (2).

Numerous other examples of the employment of the invention could be given; however, the description of it above will enable the specialist to determine them without difficulty by reference to the fact that the invention basically consists of measuring a fault current signal associated with the resistance $R_d$ by forming a composite monitoring signal from a linear combination of a signal representative of the homopolar current and a signal representative of an inverse current.

Thus, to take a new example, the process cited above in reference to equations (4) and (5) would consist, according to the invention, of comparing the polarities of the voltages:

$$V_{ab}-X(R.I_{ab}+L.(dI_{ab}/dt)$$

and $$(R.I_{ab}+L.(dI_{ab}/dt))$$

at the moment of movement to zero of the monitoring signal $I_{pab}$, which is equal, for example, to $j.(3)^{\frac{1}{2}}.(I_o+2I_{ic})$.

What is claimed is:

1. A method for determining at a measuring point in a faulty conductor of a three-phase electrical network a fault parameter consisting of the distance between the point of measurement and such fault or the direction of such fault comprising the steps of: measuring the instantaneous voltage and current of each of the conductors of the network at the measurement point and producing measurement signals representative of the measured voltage and current for such conductors, wherein the linear resistance and inductance of the conductors are known; applying Ohm's law to the conductors to form combinations of such signals with at least one magnitude of one of said signals linked to an impedance, each combination including a monitoring signal formed from the measurement signals representative of the current associated with a fault in said faulty conductor; and assigning a value to said parameter for which a group of at least one of said combinations satisfies Ohm's law, wherein said monitoring signal representative of the fault current consists of a linear combination of a signal representative of the homopolar current in said faulty conductor and a signal representative of an inverse current in said faulty conductor.

2. The method of claim 1, wherein said monitoring signal is proportional to the sum of a signal representative of the homopolar current and of twice a signal representative of the inverse current.

3. The method of claim 2 for use in determining a fault parameter for a fault occurring between one conductor and the earth, wherein said monitoring signal is proportional to the sum of a signal representative of the homopolar current and of twice a signal representative of the inverse current associated with the faulty conductor.

4. The method of claim 2, for use in determining a fault parameter for a fault occurring between the first two of three in a three-phase electrical network, wherein said monitoring signal is proportional to the sum of a signal representative of the homopolar current and of twice a signal representative of the inverse current associated with the third conductor and displaced in phase 90° in relation to such sum.

5. Apparatus for determining, at a measuring point in a faulty conductor of a three-phase electrical network, a fault parameter consisting of the distance between the point of measurement and such fault or the direction of such fault, comprising: means for measuring the instantaneous voltage and current of the conductors of the network and for generating signals representative of the measured voltage and current for such conductors, wherein the linear resistance and inductance of the conductors are known; means for forming a composite signal made up of a linear combination of a signal representative of the homopolar current in said faulty conductor and of a signal representative of inverse current in said faulty conductor, and means for forming combinations of said measurement signals with at least one magnitude of one of said signals linked to an impedance, each combination including a monitoring signal representative of the current associated with a fault in said faulty conductor, and for assigning a value to said fault parameter for which a group of at least one of said combinations satisfies Ohm's law; wherein said composite signal is applied to said means for forming combinations to constitute said monitoring signal representative of fault current.

* * * * *